(12) United States Patent
Rong et al.

(10) Patent No.: US 9,529,380 B1
(45) Date of Patent: Dec. 27, 2016

(54) LOCAL OSCILLATOR SIGNAL GENERATION CIRCUIT WITH HARMONIC CURRENT REJECTION

(71) Applicant: QUALCOMM Incorporated, San Diego, CA (US)

(72) Inventors: Sujiang Rong, San Diego, CA (US); Rajagopalan Rangarajan, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/818,191

(22) Filed: Aug. 4, 2015

(51) Int. Cl.
*G06F 1/04* (2006.01)
*H03K 21/02* (2006.01)
*H03K 5/01* (2006.01)
*H03K 5/00* (2006.01)

(52) U.S. Cl.
CPC ........ *G06F 1/04* (2013.01); *H03K 5/01* (2013.01); *H03K 21/026* (2013.01); *H03K 2005/00013* (2013.01)

(58) Field of Classification Search
CPC ............... G06F 1/04; H03K 3/00; H03K 5/01; H03K 21/026
USPC ........................................ 327/117, 291, 299
See application file for complete search history.

(56) References Cited

U.S. PATENT DOCUMENTS

| | | | |
|---|---|---|---|
| 6,404,293 B1* | 6/2002 | Darabi | H03B 21/01 331/37 |
| 8,456,203 B2 | 6/2013 | Kondou | |
| 2008/0055009 A1* | 3/2008 | Lerner | H03B 21/00 331/37 |
| 2008/0055010 A1 | 3/2008 | Lerner et al. | |
| 2009/0325510 A1* | 12/2009 | Pullela | H03D 7/1441 455/76 |
| 2010/0327920 A1* | 12/2010 | Newton | H03K 4/026 327/126 |
| 2011/0051838 A1 | 3/2011 | Asuri et al. | |
| 2013/0229954 A1 | 9/2013 | Narathong et al. | |
| 2015/0016492 A1 | 1/2015 | Koli | |
| 2015/0031320 A1 | 1/2015 | Li et al. | |
| 2015/0070071 A1 | 3/2015 | Andersson et al. | |

FOREIGN PATENT DOCUMENTS

WO      2008135954 A2      11/2008

OTHER PUBLICATIONS

International Search Report and Written Opinion—PCT/US2016/041177—ISA/EPO—Sep. 26, 2016.

* cited by examiner

*Primary Examiner* — William Hernandez
(74) *Attorney, Agent, or Firm* — Procopio, Cory, Hargreaves & Savitch LLP

(57) ABSTRACT

A circuit for generating a local oscillator signal includes: at least one divider module configured to receive an input signal and divide a frequency of the input signal by a division ratio; and a load circuit coupled to the at least one divider module, the load circuit configured to provide balanced current pulses that substantially reduce at least a portion of harmonic current ripples in the local oscillator signal.

27 Claims, 11 Drawing Sheets

LOCAL OSCILLATOR SIGNAL GENERATION CIRCUIT WITH HARMONIC CURRENT REJECTION

BACKGROUND

Field

This disclosure relates generally to a local oscillator signal generator, and more specifically, to a local oscillator signal generator with VDD/GND harmonic current rejection.

Background

Due to stringent phase noise, slew rate, and duty cycle requirements, a local oscillator (LO) circuit can draw large current in the range of tens of milliamps. Thus, an LO circuit that operates rail to rail can generate a strong harmonic current ripple (going from the ground voltage (GND) to a maximum voltage ($V_{DD}$)) at multiple LO frequencies. Such a current ripple at LO harmonic frequencies can cause interference issues. For example, an LO signal appearing at a low noise amplifier (LNA) input can become an in-band jammer. In another example involving carrier aggregation (CA), a frequency of a second receive LO signal (N*FRxlo2) can mix with a frequency of a first transmit LO signal (M*FTx1) to generate a jammer tone falling into and de-sensing the receiver in-band channel (Rx1). Further, at high frequencies, a filtering technique may not be reliable because it may be sensitive to the ground inductance and can be highly layout and floor plan dependent. Therefore, it is desirable to reduce the LO harmonic current ripple.

SUMMARY

The present disclosure describes various implementations of a local oscillator (LO) signal generator are disclosed herein.

In one embodiment, a circuit for generating a local oscillator signal is disclosed. The circuit includes: at least one divider module configured to receive an input signal and divide a frequency of the input signal by a division ratio; and a load circuit coupled to the at least one divider module, the load circuit configured to provide balanced current pulses that substantially reduce at least a portion of harmonic current ripples in the local oscillator signal.

In another embodiment, a method of generating a local oscillator signal is disclosed. The method includes: receiving an input signal at at least one divider module; generating a local oscillator signal by dividing the received input signal via the at least one divider module using a division ratio; and configuring a load circuit to provide balanced current pulses that reduce at least a portion of harmonic current ripples from the generated local oscillator signal.

In yet another embodiment, an apparatus for generating a local oscillator signal is disclosed. The apparatus includes: means for dividing a received input signal by a division ratio to generate a local oscillator signal; and means for providing balanced current pulses that reduce harmonic current ripples in the generated local oscillator signal.

Other features and advantages of the present disclosure should be apparent from the present description which illustrates, by way of example, aspects of the disclosure.

BRIEF DESCRIPTION OF THE DRAWINGS

The details of the present disclosure, both as to its structure and operation, may be gleaned in part by study of the appended further drawings, in which like reference numerals refer to like parts, and in which.

DETAILED DESCRIPTION

Several different embodiments of an LO signal generation circuit with reduced harmonic current ripple are disclosed herein. In one embodiment, the LO signal generation circuit is configured to reduce the harmonic current ripple by including additional building blocks, such as dividers, buffers/inverters, AND/NAND gates, OR/NOR gates and/or delay lines to balance the load on a divider module within the LO signal generation circuit. Thus, in one embodiment, by adding the extra building blocks, the new configuration of the LO signal generation circuit rejects at least a portion of the $V_{DD}$/GND harmonic current ripples. In one LO signal generation circuit, the circuit rejects $V_{DD}$/GND harmonic current ripples with frequencies less than two times the divider input frequency.

After reading this description it will become apparent how to implement the disclosure in various implementations and applications. Although various implementations of the present disclosure will be described herein, it is understood that these implementations are presented by way of example only, and not limitation. As such, this detailed description of various implementations should not be construed to limit the scope or breadth of the present disclosure.

The term "exemplary" is used herein to mean "serving as an example, instance, or illustration." Any design described herein as "exemplary" is not necessarily to be construed as preferred or advantageous over other designs. The detailed description includes specific details for the purpose of providing a thorough understanding of the exemplary designs of the present disclosure. It will be apparent to those skilled in the art that the exemplary designs described herein may be practiced without these specific details. In some instances, well-known structures and devices are shown in block diagram form in order to avoid obscuring the novelty of the exemplary designs presented herein.

Figure 1:
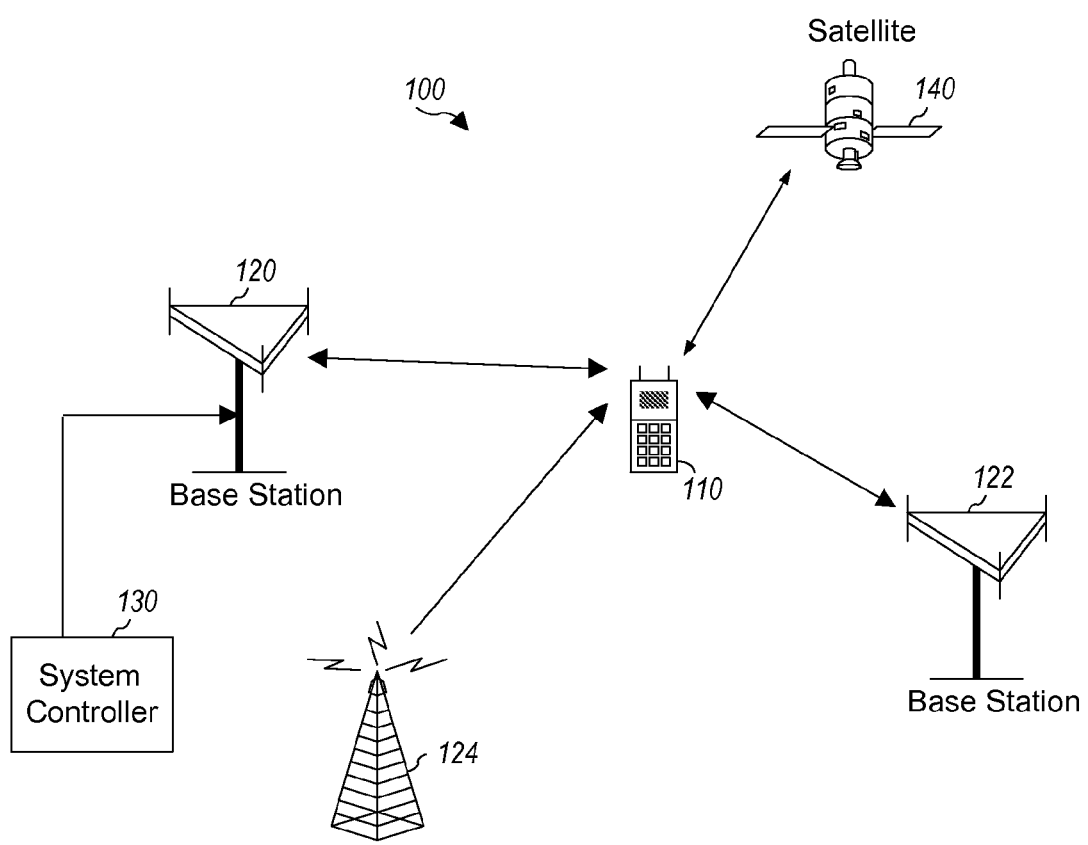
FIG. 1 is an exemplary wireless device communicating with a wireless communication system.

FIG. 1 is an exemplary wireless device 110 communicating with a wireless communication system 100. Wireless communication system 100 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1X, Evolution-Data Optimized (EVDO), Time Division Synchronous CDMA (TD-SCDMA), or some other version of CDMA. For simplicity, FIG. 1 shows wireless communication system 100 including two base stations 120 and 122 and one system controller 130. In general, a wireless system may include any number of base stations and any set of network entities.

Wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a cordless phone, a wireless local loop (WLL) station, a Bluetooth device, etc. Wireless device 110 may communicate with wireless system 100. Wireless device 100 may also receive signals from broadcast stations (e.g., broadcast station 124), signals from satellites (e.g., satellite 140) in one or more global navigation satellite systems (GNSS), etc. Wireless device 110 may support one or more radio technologies for wireless communication including LTE, WCDMA, CDMA 1x, EVDO, TD-SCDMA, GSM, 802.11, etc.

Figure 2:
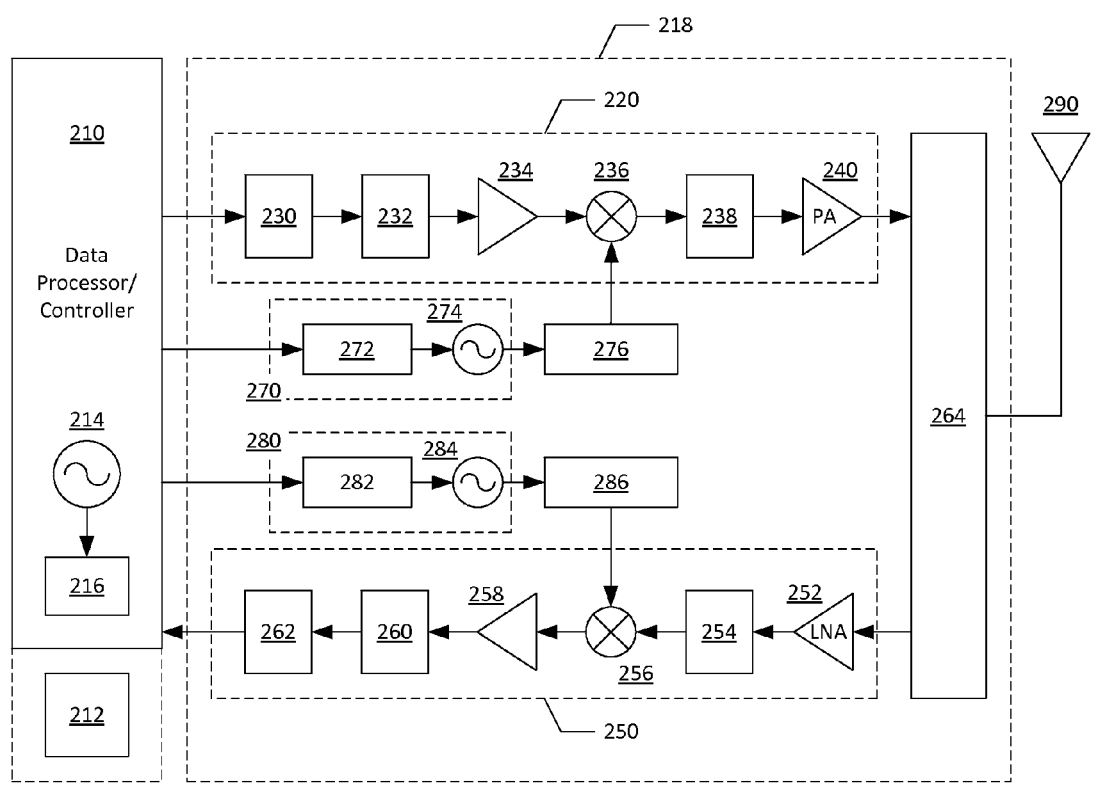
FIG. 2 is a functional block diagram of an exemplary wireless device in accordance with one embodiment of the present disclosure.

FIG. 2 is a functional block diagram of an exemplary wireless device 200 in accordance with one embodiment of the present disclosure. The wireless device 200 may correspond to the wireless device 110 shown in FIG. 1. The wireless device 200 includes a data processor/controller 210, a transceiver 218, and an antenna 290. The data processor/controller 210 may include the data processor/controller 210 or both the data processor/controller 210 and the memory 212. The transceiver 218 includes a transmitter 220 and a receiver 250 that support bi-directional communication. The transmitter 220 and/or the receiver 250 may be implemented with a super-heterodyne architecture or direct-conversion architecture. In the super-heterodyne architecture, a signal is frequency converted between radio frequency (RF) and baseband in multiple stages, e.g., from RF to an intermediate frequency (IF) in one stage, and then from IF to baseband in another stage for a receiver. In the direct-conversion architecture, which is also referred to as a zero-IF (ZIF) architecture, a signal is frequency converted between RF and baseband in one stage. The super-heterodyne and direct-conversion architectures may use different circuit blocks and/or have different requirements. In the exemplary design shown in FIG. 2, the transmitter 220 and the receiver 250 are implemented with the direct-conversion architecture.

In the transmit path, the data processor/controller 210 may process (e.g., encode and modulate) data to be transmitted and provide the data to a digital-to-analog converter (DAC) 230. The DAC 230 converts a digital input signal to an analog output signal. The analog output signal is provided to a transmit (TX) baseband (lowpass) filter 232, which may filter the analog output signal to remove images caused by the prior digital-to-analog conversion by the DAC 230. An amplifier 234 may amplify the signal from the TX baseband filter 232 and provide an amplified baseband signal. An upconverter (mixer) 236 may receive the amplified baseband signal and a TX local oscillator (LO) signal from a TX LO signal generator 276. The upconverter 236 may upconvert the amplified baseband signal with the TX LO signal and provide an upconverted signal. A filter 238 may filter the upconverted signal to remove images caused by the frequency upconversion. A power amplifier (PA) 240 may amplify the filtered RF signal from the filter 238 to obtain the desired output power level and provide an output RF signal. The output RF signal may be routed through a duplexer/switch 264.

For frequency-division duplexing (FDD), the transmitter 220 and the receiver 250 may be coupled to the duplexer 264, which may include a TX filter for the transmitter 220 and a receive (RX) filter for the receiver 250. The TX filter may filter the output RF signal to pass signal components in a transmit band and attenuate signal components in a receive band. For time-division duplexing (TDD), the transmitter 220 and the receiver 250 may be coupled to the switch 264. The switch 264 may pass the output RF signal from the transmitter 220 to the antenna 290 during uplink time intervals. For both FDD and TDD, the duplexer/switch 264 may provide the output RF signal to the antenna 290 for transmission via a wireless channel.

In the receive path, the antenna 290 may receive signals transmitted by base stations and/or other transmitter stations and may provide a received RF signal. The received RF signal may be routed through duplexer/switch 264. For FDD, the RX filter within the duplexer 264 may filter the received RF signal to pass signal components in a receive band and attenuate signal components in the transmit band. For TDD, the switch 264 may pass the received RF signal from the antenna 290 to the receiver 250 during downlink time intervals. For both FDD and TDD, the duplexer/switch 264 may provide the received RF signal to the receiver 250.

Within the receiver 250, the received RF signal may be amplified by a low noise amplifier (LNA) 252 and filtered by a filter 254 to obtain an input RF signal. A downconverter (mixer) 256 may receive the input RF signal and an RX LO signal from an RX LO signal generator 286. The downconverter 256 may downconvert the input RF signal with the RX LO signal and provide a downconverted signal. The downconverted signal may be amplified by an amplifier 258 and further filtered by an RX baseband (lowpass) filter 260 to obtain an analog input signal. The analog input signal is provided to an analog-to-digital converter (ADC) 262. The ADC 262 converts an analog input signal to a digital output signal. The digital output signal is provided to the data processor/controller 210.

A TX frequency synthesizer 270 may include a TX phase locked loop (PLL) 272 and a VCO 274. The VCO 274 may generate a TX VCO signal at a desired frequency. The TX PLL 272 may receive timing information from the data processor/controller 210 and generate a control signal for the VCO 274. The control signal may adjust the frequency and/or the phase of the VCO 274 to obtain the desired frequency for the TX VCO signal. The TX frequency synthesizer 270 provides the TX VCO signal to the TX LO signal generator 276. The TX LO signal generator may generate a TX LO signal based on the TX VCO signal received from the TX frequency synthesizer 270.

A RX frequency synthesizer 280 may include an RX PLL 282 and a VCO 284. The VCO 284 may generate an RX VCO signal at a desired frequency. The RX PLL 282 may receive timing information from the data processor/controller 210 and generate a control signal for the VCO 284. The control signal may adjust the frequency and/or the phase of the VCO 284 to obtain the desired frequency for the RX VCO signal. The RX frequency synthesizer 280 provides the RX VCO signal to the RX LO signal generator 286. The RX LO signal generator may generate an RX LO signal based on the RX VCO signal received from the RX frequency synthesizer 280.

The LO signal generators 276, 286 may each include frequency dividers, buffers/inverters, etc. The LO signal generators 276, 286 may be referred to as frequency dividers if they divide a frequency provided by the TX frequency synthesizer 270 and the RX frequency synthesizer 280, respectively. The PLLs 272, 282 may each include a phase/frequency detector, a loop filter, a charge pump, a frequency divider, etc. Each VCO signal and each LO signal may be a periodic signal with a particular fundamental frequency. The TX LO signal and the RX LO signal from the LO generators 276, 286 may have the same frequency for TDD or different frequencies for FDD. The TX VCO signal and the RX VCO signal from the VCOs 274, 284 may have the same frequency (e.g., for TDD) or different frequencies (e.g., for FDD or TDD).

The conditioning of the signals in the transmitter 220 and the receiver 250 may be performed by one or more stages of amplifier, filter, upconverter, downconverter, etc. These circuits may be arranged differently from the configuration shown in FIG. 2. Furthermore, other circuits not shown in FIG. 2 may also be used to condition the signals in the transmitter 250 and the receiver 220. For example, impedance matching circuits may be located at the output of the PA 240, at the input of the LNA 252, between the antenna 290 and the duplexer/switch 264. Some circuits in FIG. 2 may also be omitted. For example, the filter 238 and/or the filter 254 may be omitted. All or a portion of the transceiver 218 may be implemented on one or more analog integrated circuits (ICs), RF ICs, mixed-signal ICs, or other similarly-configured circuits. For example, the TX baseband filter 232 to the PA 240 in the transmitter 220, the LNA 252 to the RX baseband filter 260 in the receiver 250, the PLLs 272, 282, the VCOs 274, 284, and the LO signal generators 276, 286 may be implemented on an RF IC. The PA 240 and possibly other circuits may also be implemented on a separate IC or a circuit module.

The data processor/controller 210 may perform various functions for the wireless device. For example, the data processor/controller 210 may perform processing for data being transmitted via the transmitter 220 and received via the receiver 250. The data processor/controller 210 may control the operation of various circuits within the transmitter 220 and the receiver 250. The memory 212 may store program codes and data for the data processor/controller 210. The memory 212 may be internal or external to the data processor/controller 210. The memory 212 may be referred to as a computer-readable medium. An oscillator 214 may generate a VCO signal at a particular frequency. A clock generator 216 may receive the VCO signal from the oscillator 214 and may generate clock signals for various modules within the data processor/controller 210. The data processor/controller 210 may be implemented on one or more application specific integrated circuits (ASICs) and/or other ICs.

Frequency dividers, such as the frequency dividers 276, 286, are used extensively for generating LO signals. There is a need for a programmable frequency divider for generating LO signals in multi-band cellular transceivers that meets stringent LO requirements such as small chip area, good phase noise requirement, and quadrature output.

Figure 3:
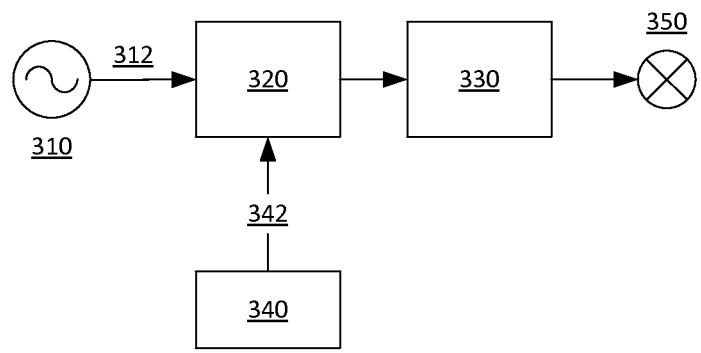
FIG. 3 is a functional block diagram illustrating an LO signal generator in accordance with one embodiment of the present disclosure.

FIG. 3 is a functional block diagram illustrating an LO signal generator 300 in accordance with one embodiment of the present disclosure. As shown in FIG. 3, a VCO 310 provides VCO signals 312 to a programmable harmonic generator 320. The VCO 310 may correspond to the VCO 274 and/or the VCO 284 shown in FIG. 2. The programmable harmonic generator 320 receives a division ratio selection 342 (e.g., 2, 3, or 4) from a division ratio selection module 340. The programmable harmonic generator 320 generates control signals based on the VCO signals 312 and the division ratio selection 342, and provides the control signals to a programmable LO divider 330. The programmable harmonic generator 320 and the programmable LO divider 330 may correspond to the TX LO signal generator 276 and/or the RX LO signal generator 286 shown in FIG. 2. Based on the control signals, the programmable LO divider 330 generates LO signals corresponding to the selected division ratio. The output of the programmable LO divider 330 is coupled to a mixer 350 for downconverting or upconverting. The LO signal generator 300 may provide various divide by ratios such as divide by two, three, four, five, six, eight, and ten division ratios. The available division ratios may allow for a lower VCO tuning range percentage, and therefore may allow the VCO 310 (also each of the VCOs 276, 286) to be implemented with only one VCO.

Figure 4A:
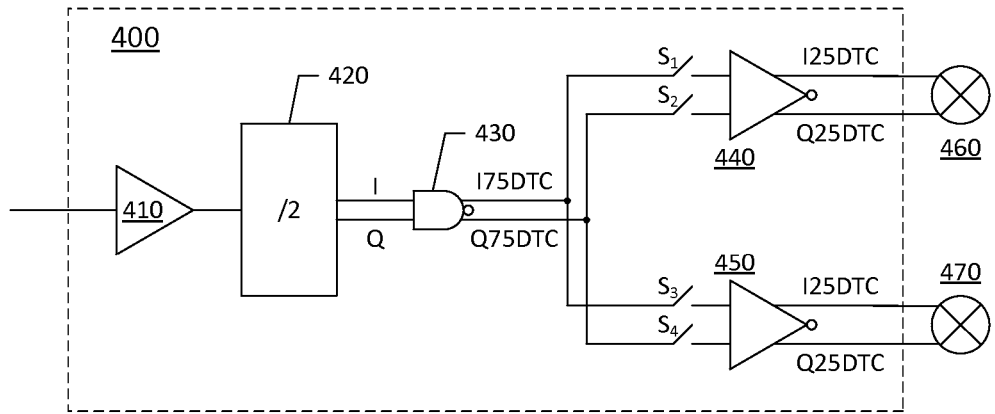
FIG. 4A is a functional block diagram of a div-2 LO circuit in accordance with one embodiment of the present disclosure.
Figure 6A:
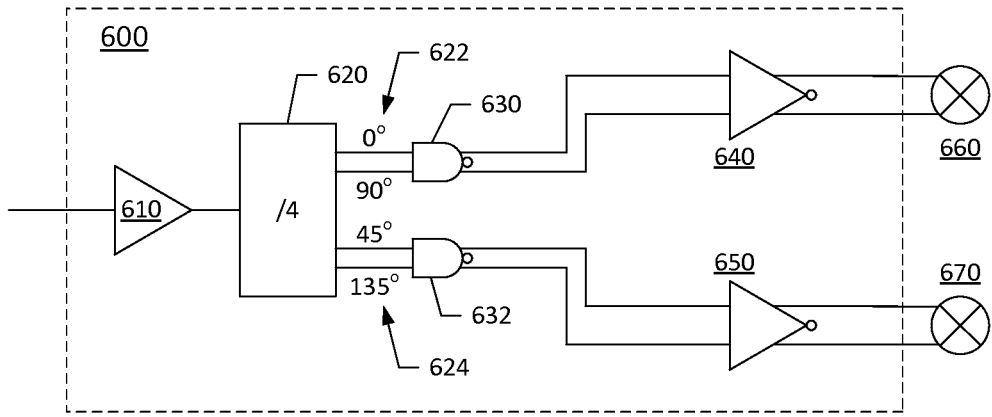
FIG. 6A is a functional block diagram of a div-4 HR mode LO circuit in accordance with one embodiment of the present disclosure.
Figure 8A:
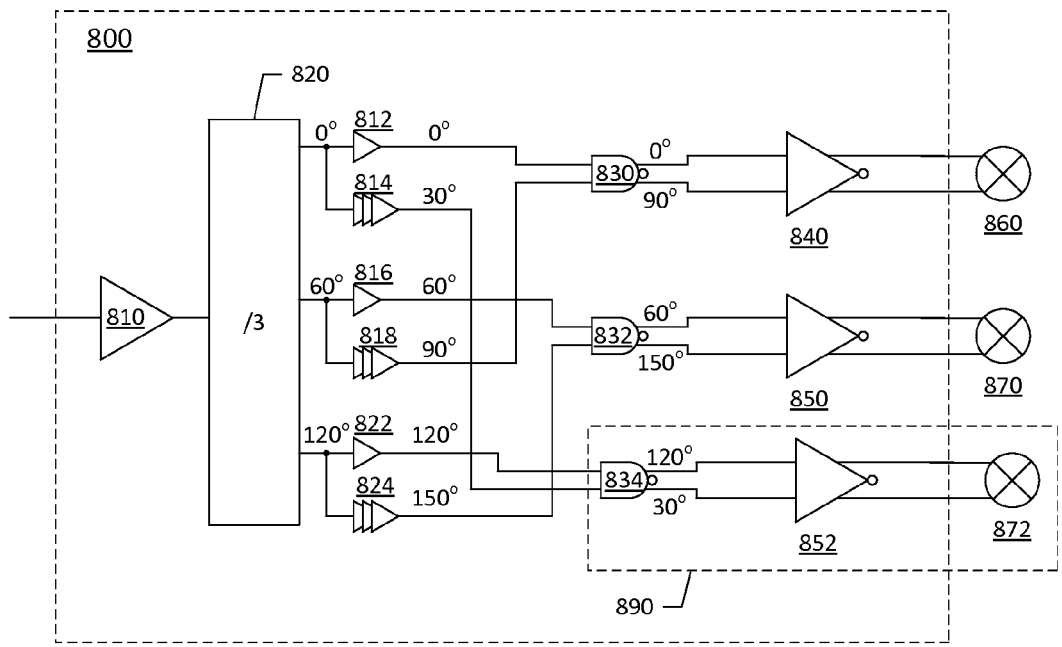
FIG. 8A is a functional block diagram of a div-3 HR mode LO circuit in accordance with one embodiment of the present disclosure.

As stated above, it is desirable to reduce the LO harmonic current ripple in an LO signal generation circuit. Several embodiments of an LO signal generation circuit with reduced harmonic current ripple are illustrated in FIGS. 4A, 4B, 6A, 6B, 8A, 8B, and 9. FIG. 4A, FIG. 6A, and FIG. 8A illustrate examples of a divide-by-2 (div-2) harmonic rejection (HR) mode LO circuit, a divide-by-4 (div-4) HR mode LO circuit, and a divide-by-3 (div-3) HR mode LO circuit, respectively. These HR mode LO circuits are configured to reduce the second harmonic frequency (2×Flo) and the fourth harmonic frequency (4×Flo) of the current going into the power lines ($V_{DD}$/GND network). In one embodiment, the HR mode LO circuit is configured to reduce the harmonic current ripple by including additional building blocks (e.g., dividers, buffers/inverters, AND/NAND gates, OR/NOR gates and/or delay lines. By adding the extra building blocks, the new configuration of the HR mode LO circuit rejects at least a portion of the $V_{DD}$/GND harmonic current ripples, for example, $V_{DD}$/GND harmonic with frequencies less than two times the divider input frequency (2×Fin), which typically is equal to two times the voltage-controlled oscillator (VCO) frequency. Thus, the main function of the added HR building blocks is to generate extra current ripples with more phases to balance out VDD/GND current ripples and remove a substantial portion of the VDD/GND harmonic current within a range of frequencies. For example, for an HR LO circuit configured with a different input, the added HR building blocks may be configured to remove substantial portion of the VDD/GND harmonic current with frequencies less than two times the input frequency. In a single-ended input configuration, the added HR building blocks may be configured to remove substantial portion of the VDD/GND harmonic current with frequencies less than one times the input frequency. If the input is differential in-phase/quadrature (IQ), the added HR building blocks may be configured to remove substantial portion of the VDD/GND harmonic current with frequencies less than four times the input frequency. The added HR building blocks may be further configured to balance the load of a previous stage. Although only div-2, div-3, and div-4 circuits are illustrated, same principle or design guidelines can be also applied to local oscillators with other division ratios.

FIG. 4A is a functional block diagram of a div-2 LO circuit 400 in accordance with one embodiment of the present disclosure. The div-2 LO circuit 400 includes a mid-band buffer 410, a div-2 module 420, a NAND gate 430, a primary receiver (PRx) LO buffer 440, a diversity receiver (DRx) LO buffer 450, and switches $S_1$ to $S_4$, which are used to select PRx LO buffer 440 and/or DRx LO buffer 450. The output of the div-2 LO circuit 400 is sent to mixer 460 or mixer 470. As illustrated in FIG. 4A, the div-2 module 420 receives the input signal through the mid-band buffer 410 and generates in-phase and quadrature phase outputs to the NAND gate 430. The NAND gate 430 receives two input signals (I and Q), which are in-phase signal with 50% duty cycle (I) and quadrature signal with 50% duty cycle (Q). The NAND gate 430 outputs two signals, an in-phase signal with 75% duty cycle (I75DTC) and a quadrature signal with 75% duty cycle (Q75DTC). These two signals are input to the LO buffers/inverters 440, 450 through switches $S_1$ to $S_4$, with switches $S_1$ and $S_2$ used to select the LO buffer 440 while switches $S_3$ and $S_4$ are used to select the LO buffer/inverter 450. Each of the LO buffers/inverters 440, 450 outputs two signals, an in-phase signal with 25% duty cycle (I25DTC) and a quadrature signal with 25% duty cycle (Q25DTC), which are inverse of the I75DTC and Q75DTC signals, respectively. The outputs of the LO buffers/inverters 440, 450 are coupled to the mixers 460, 470.

In FIG. 4A (and in all subsequent figures), each line (e.g., line I or line Q) represents a pair of differential lines. For example, line I represents a pair of differential lines I and Ib, and line Q represents a pair of differential lines Q and Qb. Thus, connections to the NAND gate 430 are shown as having I and Q inputs and I75DTC and Q75DTC outputs for simplicity. In an actual circuit implementation, the NAND gate 430 would be configured with four NAND gates having four inputs and four outputs. In one embodiment, the first NAND gate would receive I and Q inputs and output I75DTC signal, the second NAND gate would receive Q and Ib inputs and output Q75DTC signal, the third NAND gate would receive Ib and Qb and output Ib75DTC signal (i.e., the inverse of I75DTC signal), and the fourth NAND gate would receive Qb and I inputs and output Qb75DTC signal (i.e., the inverse of Q75DTC signal). Further, an actual circuit implementation of buffer 440 (as well as LO buffer 450 and other LO buffers and dummy buffers in all subsequent figures) is configured with four inverters with inputs corresponding to the outputs of the four NAND gates. In other embodiments, different configurations of inputs (e.g., single-ended) can be coupled to different numbers of NAND gates and LO buffers to produce different configurations of outputs.

Figure 4B:
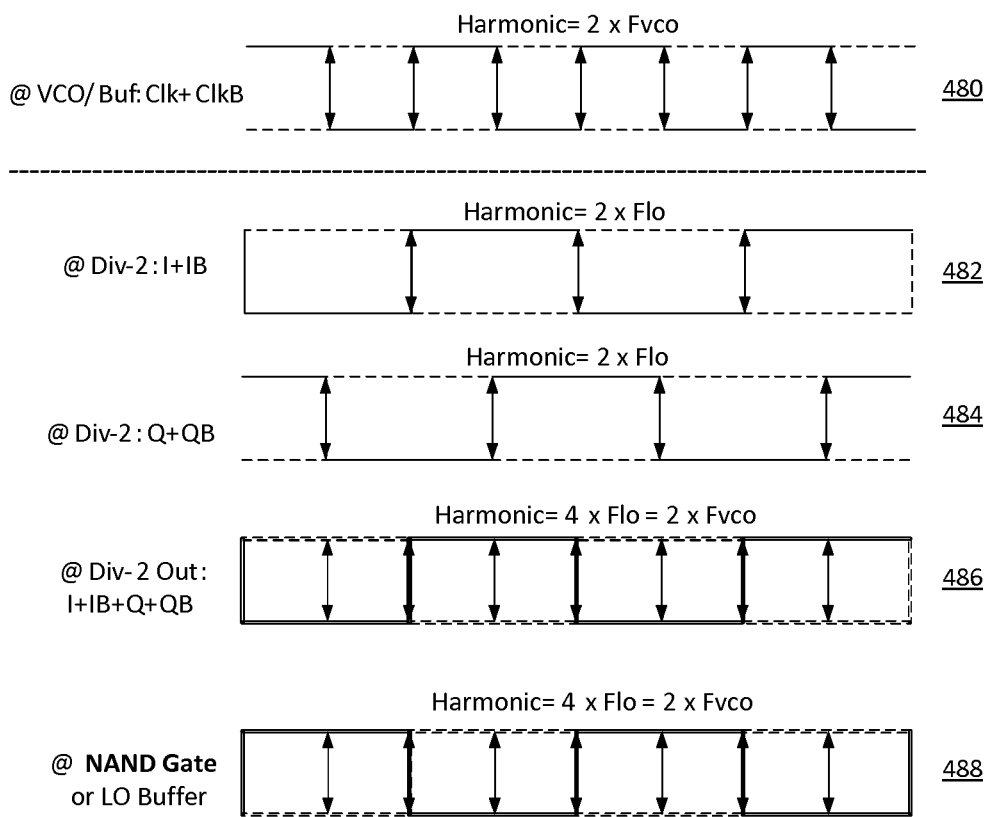
FIG. 4B illustrates transient waveforms at different points in the div-2 LO circuit shown in FIG. 4A.

FIG. 4B illustrates transient waveforms at different points in the div-2 LO circuit 400 shown in FIG. 4A. The double-sided arrows highlight the rising and falling edges of the transient waveform. Large current pulses are drawn from $V_{DD}$ or dumped into GND at these edges. In the illustrated embodiment of FIG. 4B, transient waveform 480 shows that the harmonic current frequency at the input of the div-2 LO circuit 400 is equal to two times the frequency of the VCO (2×Fvco), or two times the input frequency (2×Fin), due to the differential circuitry. Transient waveforms 482, 484 show that the harmonic current frequencies of individual signals I/Ib and Q/Qb at the output of the div-2 module is two times the frequency of the LO (2×Flo), which is equivalent to one times the frequency of the VCO (1×Fvco). However, by combining the VDD/GND current pulses from symmetrical NAND gate 430, switches $S_1$ to $S_4$, primary and diversity LO buffers 440 and 450, in term of I/Ib and Q/Qb, the harmonic current frequency is increased to four times the frequency of the LO (4×Flo), or 2× Fvco, as shown by transient waveforms 486, 488.

Figure 5A:
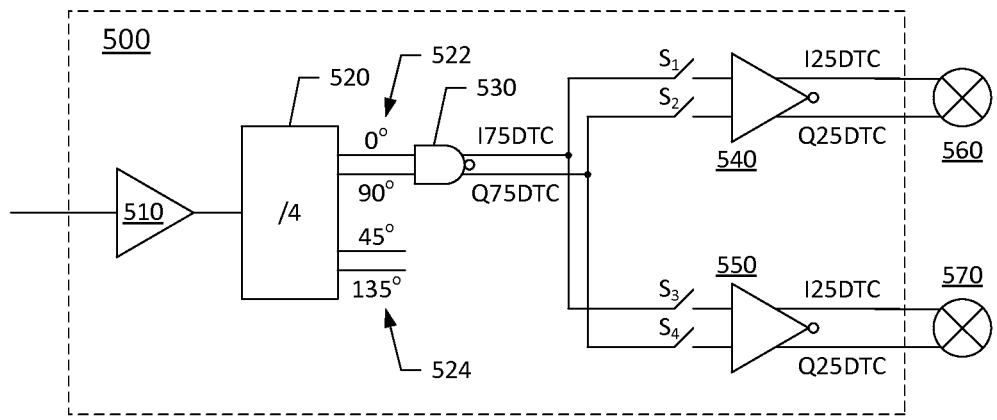
FIG. 5A is a functional block diagram of a conventional div-4 LO circuit.

FIG. 5A is a functional block diagram of a conventional div-4 LO circuit 500. The div-4 LO circuit 500 includes a mid-band buffer 510, a div-4 module 520, a NAND gate 530, a PRx LO buffer 540, a DRx LO buffer 550, and switches $S_1$ to $S_4$, which are used to select PRx LO buffer 540 and/or DRx LO buffer 550. The output of the div-4 LO circuit 500 is sent to mixer 560 or mixer 570. In FIG. 5A, the div-4 module 520 generates four I/Q phase outputs (i.e., 0°, 90°, 45°, 135°). However, only two 0° and 90° phase outputs 522 of the div-4 module 520 are used to feed the NAND gate 530, which drives either or both of the PRx LO buffer 540 and the DRx LO buffer 550. The other two 45° and 135° phase outputs 524 are not buffered or used. Thus, the conventional div-4 LO circuit 500 is configured substantially similar to the div-2 LO circuit 400, but with an input VCO frequency and division ratio that is doubled.

Figure 5B:
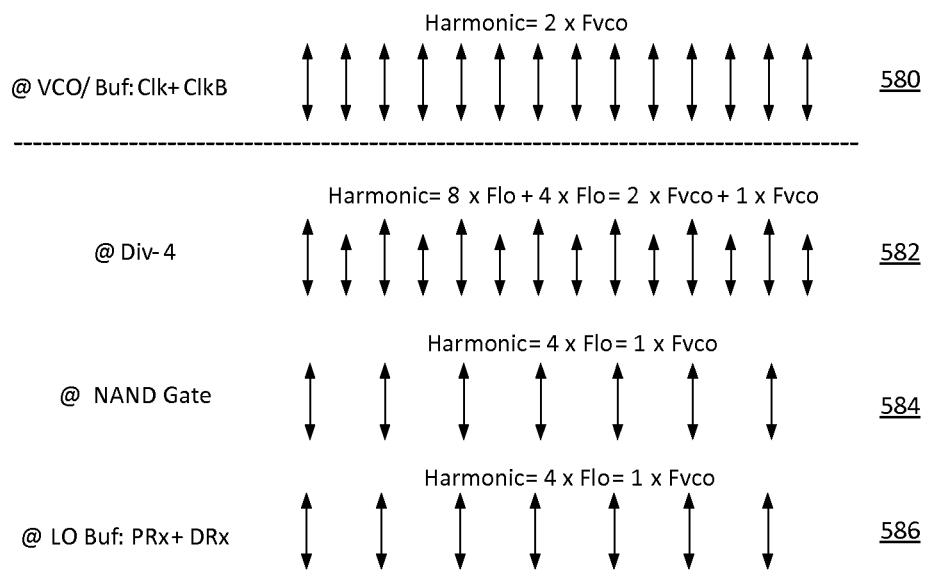
FIG. 5B illustrates transient waveforms at different points in the div-4 LO circuit shown in FIG. 5A.

FIG. 5B illustrates transient waveforms at different points in the div-4 LO circuit 500 shown in FIG. 5A. The $V_{DD}$/GND current pulse is quantified with the magnitude of the arrow. In the illustrated embodiment of FIG. 5B, transient waveform 580 shows that the harmonic current frequency at the input of the div-4 LO circuit 500 is equal to 2×Fvco, or eight times the frequency of the LO (8×Flo). However, transient waveform 582 shows that the conventional div-4 LO circuit 500 generates a strong 4× Flo (or 1×Fvco) harmonic current at the output of the div-4 module 520, in addition to the 8×Flo (or 2×Fvco) harmonic current. Accordingly, transient waveforms 584, 586 show that the harmonic current frequency at the output of the NAND gate 530 and the LO buffers 540, 550 is at 4×Flo (or 1×Fvco).

FIG. 6A is a functional block diagram of a div-4 HR mode LO circuit 600 in accordance with one embodiment of the present disclosure. The div-4 HR mode LO circuit 600 includes a mid-band buffer 610, a div-4 module 620, a pair of NAND gates 630, 632, a PRx LO buffer 640, and a DRx LO buffer 650. The output of the div-4 HR mode LO circuit 600 is sent to mixer 660 and mixer 670. In FIG. 6A, the div-4 module 620 generates and uses all four I/Q phase outputs (i.e., 0°, 90°, 45°, 135°), in contrast to the div-4 module 520 in the div-4 LO circuit 500 of FIG. 5A. Two 0° and 90° phase outputs 622 of the div-4 module 620 are used to feed the NAND gate 630, which drives the PRx LO buffer 640, while the other two 45° and 135° phase outputs 624 of the div-4 module 620 are used to feed the NAND gate 632, which drives the DRx LO buffer 650.

Figure 6B:
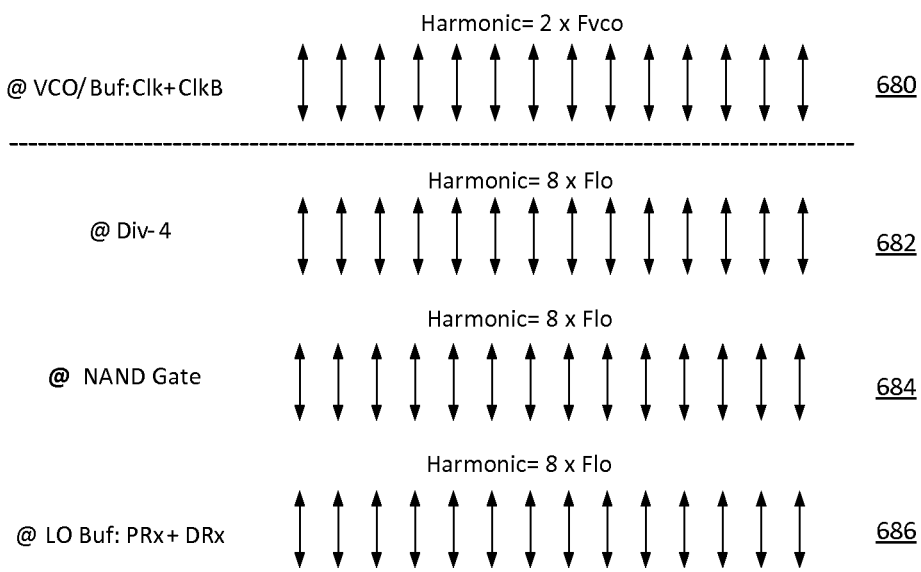
FIG. 6B illustrates transient waveforms at different points in the div-4 HR mode LO circuit shown in FIG. 6A.

FIG. 6B illustrates transient waveforms at different points in the div-4 HR mode LO circuit 600 shown in FIG. 6A. In the illustrated embodiment of FIG. 6B, transient waveform 680 shows that the harmonic current frequency at the input of the div-4 HR mode LO circuit 600 is equal to 2×Fvco (or 8×Flo). Further, transient waveforms 682, 684, 686 show that, by adding the extra NAND gate 632 in the div-4 HR mode LO circuit 600 and re-configuring the LO paths as shown in FIG. 6A, the 4× Flo (or 1×Fvco) harmonic frequency current is eliminated or substantially reduced. This leaves only the 8×Flo (or 2×Fvco) harmonic frequency current, which may be minimal. It should be noted that by adding the extra NAND gate 632 in the div-4 HR mode LO circuit 600 and re-configuring the LO paths as shown in FIG. 6A, only the 8×Flo (or 2× Fvco) harmonic frequency current remains at the output of the div-4 module 620 (see transient waveform 682), at the output of the NAND gates 630, 632 (see transient waveform 684), and at the output of the LO buffers 640, 650 (see transient waveform 686).

Figure 7A:
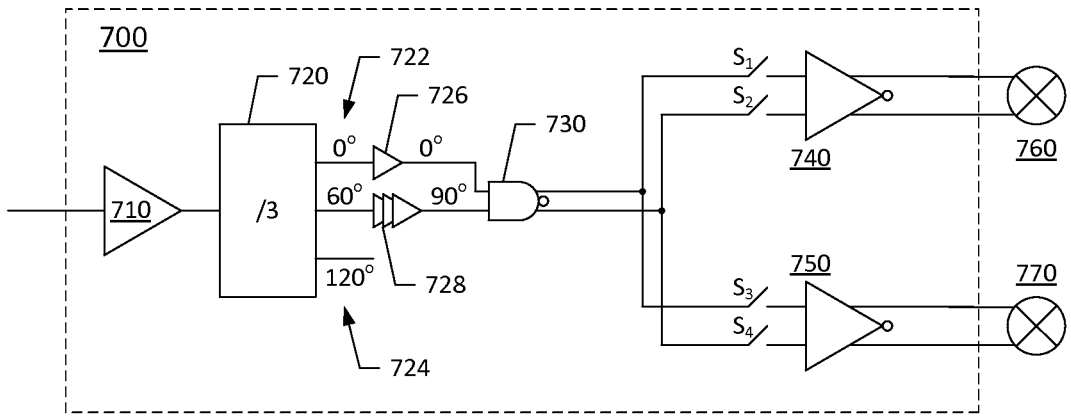
FIG. 7A is a functional block diagram of a conventional div-3 LO circuit.

FIG. 7A is a functional block diagram of a conventional div-3 LO circuit 700. The div-3 LO circuit 700 includes a mid-band buffer 710, a div-3 module 720, a plurality of buffers/delay lines 726, 728, a NAND gate 730, a PRx LO buffer 740, a DRx LO buffer 750, and switches $S_1$ to $S_4$, which are used to select PRx LO buffer 740 and/or DRx LO buffer 750. The output of the div-3 LO circuit 700 is sent to mixer 760 or mixer 770. In FIG. 7A, the div-3 module 720 generates three I/Q phase outputs (i.e., 0°, 60°, 120°). However, only two 0° and 60° phase outputs 722 of the div-3 module 720 are used to feed the NAND gate 730, which drives either or both of the PRx LO buffer 740 and the DRx LO buffer 750, through the plurality of buffers/delay lines 726, 728. The 0° phase output is coupled to the buffer 726, while the 60° phase output is coupled to the plurality of delay lines 728. In the illustrated embodiment of FIG. 7A, three delay lines 728 (which includes multiple stages of inverters) are used to rotate the current pulse from a phase of 60° to 90°, which is then fed to the NAND gate 730. The other output 120° (724) is not buffered or used.

Figure 7B:
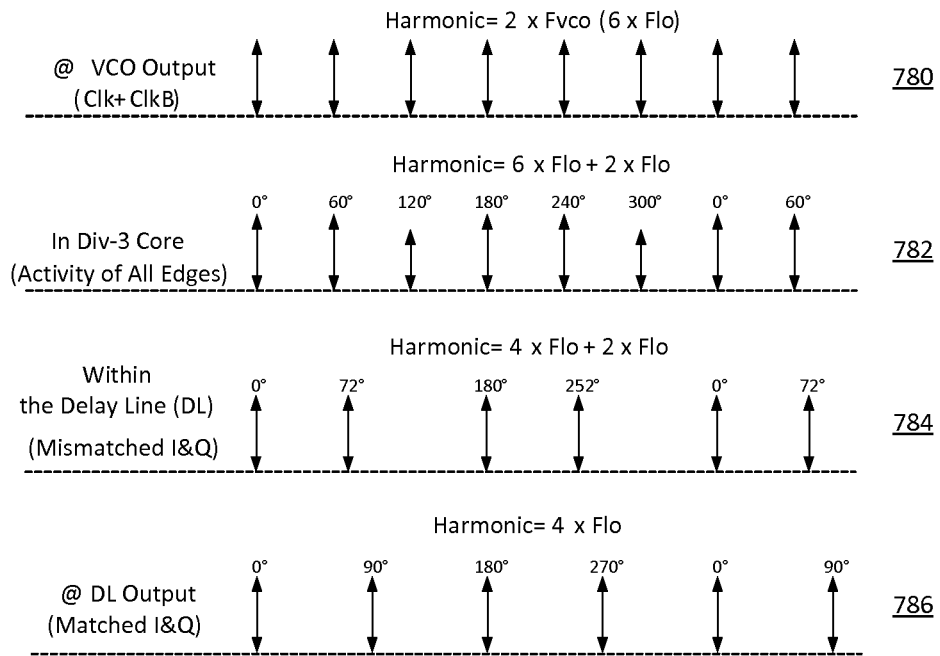
FIG. 7B illustrates transient waveforms at different points in the div-3 LO circuit shown in FIG. 7A.

FIG. 7B illustrates transient waveforms at different points in the div-3 LO circuit 700 shown in FIG. 7A. The $V_{DD}$/GND current pulse is quantified with the magnitude of the arrow. In the illustrated embodiment of FIG. 7B, transient waveform 780 shows that the harmonic current frequency at the input of the div-3 LO circuit 700 is equal to 2×Fvco (or 6×Flo). However, transient waveforms 782, 784 show that the conventional div-3 LO circuit 700 generates both 2×Flo and 4×Flo of the harmonic current in the core of the div-3 module 720 and within the delay lines 728, in addition to the 6×Flo (or 2×Fvco) harmonic current. Since only the 0° and 60° differential phase outputs are buffered (due to the loading mismatch), the current pulse magnitude at 120° phase would be smaller. Therefore, the 2×Flo harmonic current would appear at the $V_{DD}$ terminal of the div-3 module 720, in addition to the 6×Flo harmonic current. Accordingly, transient waveforms 784, 786 show that the harmonic current frequency within the delay lines 726, 728 and at the output of the delay lines 726, 728 are at 2×Flo (or ⅔× Fvco) and 4×Flo (or 4/3×Fvco), respectively, which are both less than two times the divider input frequency (2×Fvco). At the output of the delay lines 726, 728, the LO harmonic is purely 4×Flo, if there is no IQ mismatch.

FIG. 8A is a functional block diagram of a div-3 HR mode LO circuit 800 in accordance with one embodiment of the present disclosure. The div-3 HR mode LO circuit 800 includes a mid-band buffer 810, a div-3 module 820, a plurality of buffers/delay lines 812, 814, 816, 818, 822, 824, a plurality of NAND gates 830, 832, 834, a PRx LO buffer 840, a DRx LO buffer 850, and a dummy buffer 852. The output of the div-3 HR mode LO circuit 800 is sent to the mixers 860, 870 and a dummy load 872. In FIG. 8A, the div-3 module 820 generates and uses all three I/Q phase outputs (i.e., 0°, 60°, 120°), in contrast to the div-3 module 720 in the div-3 LO circuit 700 of FIG. 7A. In the illustrated embodiment of FIG. 8A, the extra delay lines 822, 824 and dummy elements 890, including the dummy NAND gate 834, the dummy buffer 852, and the dummy load 872, are added to move the LO harmonic frequency to 6×Flo, as described below with respect to FIG. 8B.

The 0° phase output is coupled to a buffer 812 and a plurality of delay lines 814 to generate a 0° phase output and a 30° phase output, respectively. The 60° phase output is coupled to a buffer 816 and a plurality of delay lines 818 to generate a 60° phase output and a 90° phase output, respectively. The 120° phase output is coupled to a buffer 822 and a plurality of delay lines 824 to generate a 120° phase output and a 150° phase output, respectively. The 0° and 90° phase outputs are input to the PRx NAND gate 830. The 60° and 150° phase outputs are input to the DRx NAND gate 832. The 120° and 30° phase outputs are input to the dummy NAND gate 834. The PRx NAND gate 830 drives the PRx LO buffer 840. The DRx NAND gate 832 drives the DRX LO buffer 850. The dummy NAND gate 834 drives the dummy mixer/load 872.

In contrast to the embodiment shown in FIG. 7A, the three outputs of the div-3 module 820 of the div-3 HR mode LO circuit 800 in FIG. 8A are substantially similarly loaded or load balanced by the delay lines 814, 818, 824.

Figure 8B:
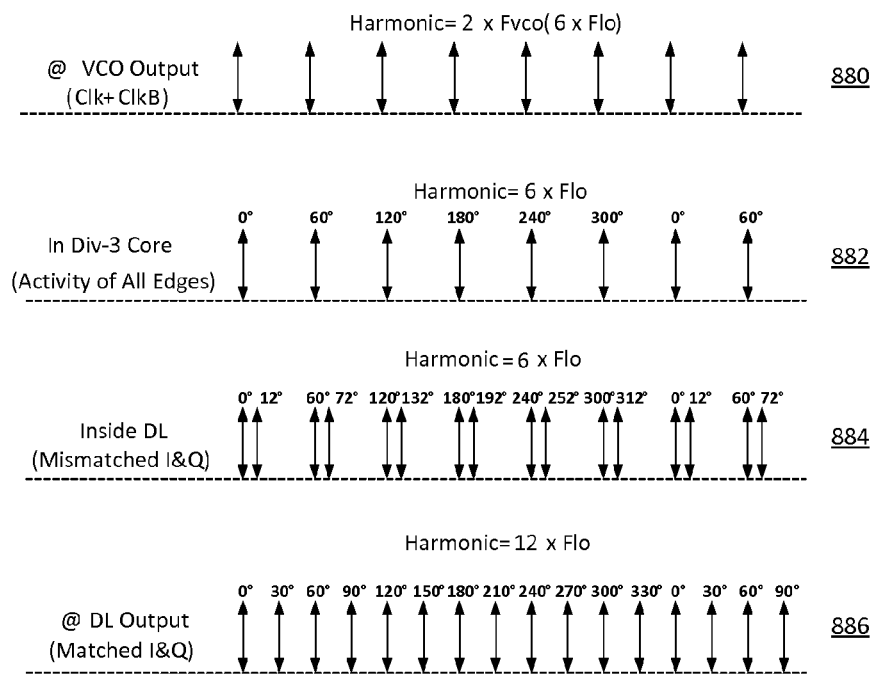
FIG. 8B illustrates transient waveforms at different points in the div-3 HR mode LO circuit shown in FIG. 8A.

FIG. 8B illustrates transient waveforms at different points in the div-3 HR mode LO circuit 800 shown in FIG. 8A. In the illustrated embodiment of FIG. 8B, transient waveform 880 shows that the harmonic current frequency at the input of the div-3 HR mode LO circuit 800 is equal to 2×Fvco (or 6×Flo). Further, transient waveforms 882, 884, 886 show that, by adding extra buffers/delay lines 814, 816, 822, 824 and extra NAND gates 832, 834 in the div-3 HR mode LO circuit 800 and re-configuring the LO paths as shown in FIG. 8A, the power line LO harmonic current is pushed out from 2×Flo and 4×Flo (see FIG. 7B) to 6×Flo or 12×Flo (see FIG. 8B).

Figure 9:
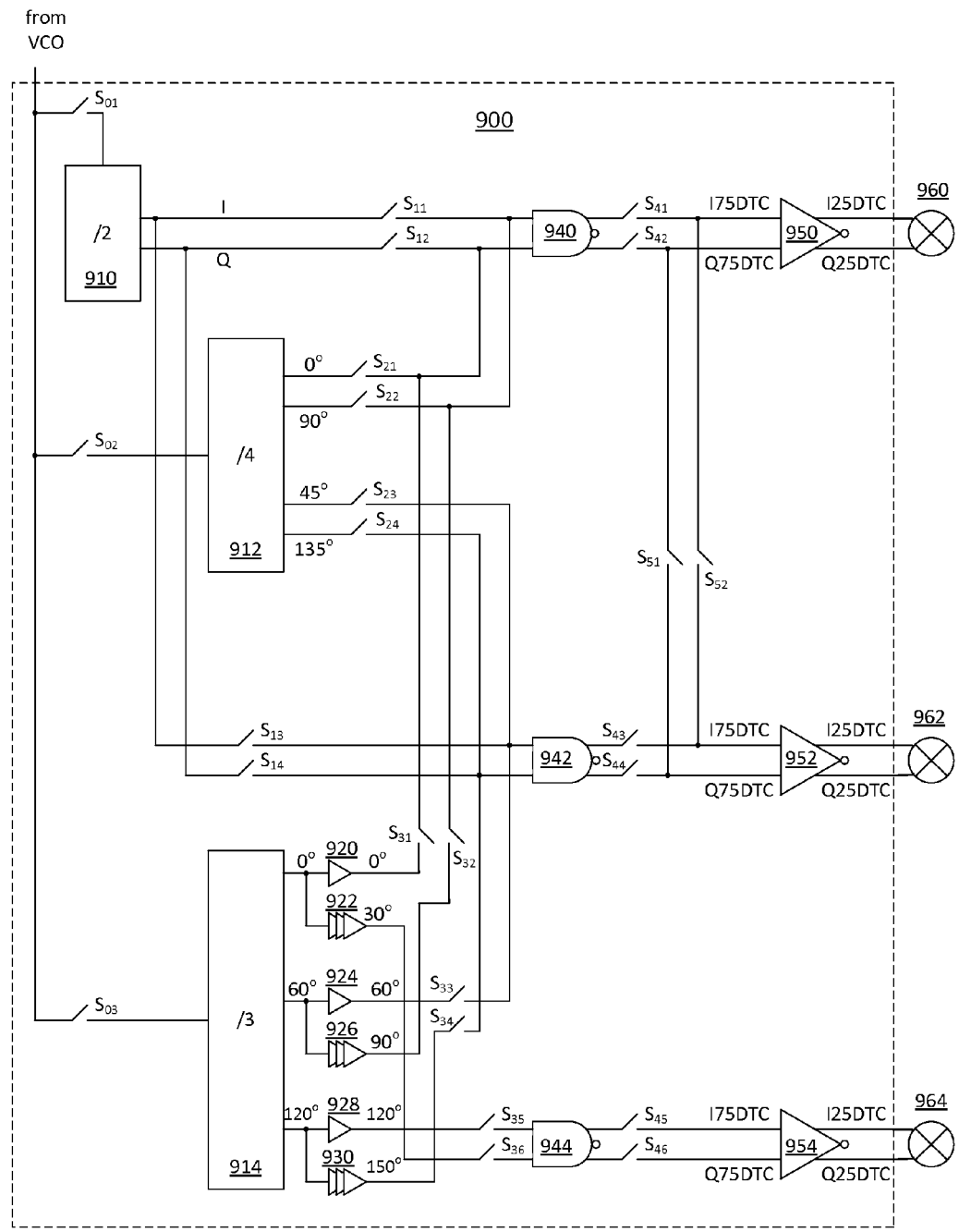
FIG. 9 is a detailed functional block diagram illustrating an LO signal generator including div-2, div-3, and div-4 HR mode LO circuits in accordance with one embodiment of the present disclosure.

FIG. 9 is a detailed functional block diagram illustrating an LO signal generator 900 including div-2, div-3, and div-4 HR mode LO circuits in accordance with one embodiment of the present disclosure. In the illustrated embodiment of FIG. 9, the LO signal generator 900 is configured to generate a local oscillator signal with a reduced harmonic current ripple. The LO signal generator 900 may include at least one divider module and a load. The at least one divider module can be configured to receive an input signal (e.g., a VCO signal) and a division ratio signal (e.g., 2, 3, or 4). The division ratio signal is used to select one module from the at least one divider module to divide the frequency of the input signal by the division ratio. The load circuit can be coupled to the at least one divider module, and can be configured to provide a substantially balanced load at outputs of the at least one divider module. In one embodiment, the load includes buffers/delay lines 920, 922, 924, 926, 928, 930, NAND gates 940, 942, 944, and LO buffers 950, 952, 954. Although only div-2, div-3, and div-4 circuits are illustrated, same principle or design guidelines can be also applied to LO signal generators with other division ratios.

In the illustrated embodiment of FIG. 9, the LO signal generator 900 receives an input from the VCO. Switches $S_{02}$, $S_{02}$, $S_{03}$ are used to select one of div-2, div-4, or div-3 HR mode LO circuit, respectively. The configuration of the div-2 HR mode LO circuit can be selected by closing switch $S_{01}$ and closing switches $S_{11}$, $S_{12}$, $S_{51}$, $S_{52}$, with all other switches opened. The configuration of the div-4 HR mode LO circuit can be selected by closing switch $S_{02}$ and closing switches $S_{21}$, $S_{22}$, $S_{23}$, $S_{24}$, $S_{41}$, $S_{42}$, $S_{43}$, $S_{44}$, with all other switches opened. The configuration of the div-3 HR mode LO circuit can be selected by closing switch $S_{03}$ and closing switches $S_{31}$, $S_{32}$, $S_{33}$, $S_{34}$, $S_{35}$, $S_{36}$, $S_{41}$, $S_{42}$, $S_{43}$, $S_{44}$, $S_{45}$, $S_{46}$, with all other switches opened. Modules 910, 912, 914 correspond to the div-2, div-4, div-3 modules 420, 620, 820 in FIGS. 4A, 6A, 8A. NAND gates 940, 942, 944 correspond to the NAND gates 430, 630, 632, 830, 832, 834 in FIGS. 4A, 6A, 8A. Buffers 950, 952, 954 correspond to the buffers 440, 450, 640, 650, 840, 850, 852 in FIGS. 4A, 6A, 8A. Mixers 960, 962, 964 correspond to the mixers 460, 470, 660, 670, 860, 870, 872 in FIGS. 4A, 6A, 8A.

The LO signal generator 900 can also be configured into a non-HR mode by closing some switches and opening other switches. For example, the configuration of a non-HR mode div-4 LO circuit can be selected by closing switch $S_{02}$ and closing switches $S_{21}$, $S_{22}$, $S_{41}$, $S_{42}$, $S_{51}$, $S_{52}$, with all other switches opened. In another example, the configuration of a non-HR mode div-3 LO circuit can be selected by closing switch $S_{03}$ and closing switches $S_{31}$, $S_{32}$, $S_{41}$, $S_{42}$, $S_{51}$, $S_{52}$, with all other switches opened. Thus, during non-HR mode, certain blocks can be turned off to minimize the current consumption.

Figure 10:
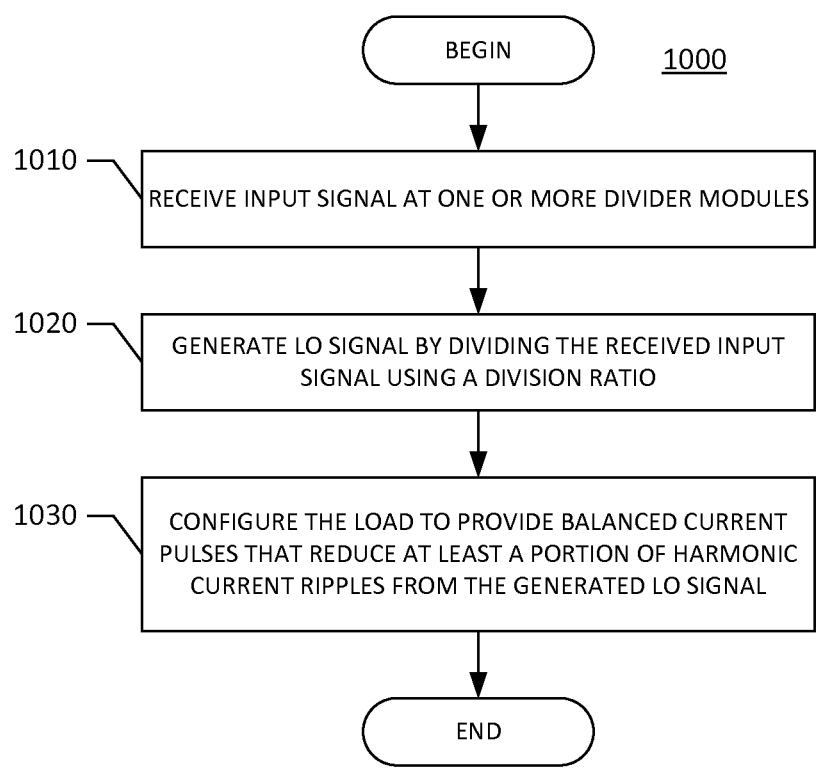
FIG. 10 is a functional flow diagram illustrating a method for generating an LO signal with reduced harmonic current ripple in accordance with one embodiment of the present disclosure.

FIG. 10 is a functional flow diagram illustrating a method 1000 for generating an LO signal with reduced harmonic current ripple in accordance with one embodiment of the present disclosure. In the illustrated embodiment of FIG. 10, the method 1000 for generating an LO signal with reduced harmonic current ripple includes receiving an input signal, at block 1010, at one or more divider modules. The LO signal is generated, at block 1020, by dividing the received input signal via the one or more divider modules using a division ratio. A load circuit is then configured, at block 1030, to provide balanced current pulses that reduce at least a portion of harmonic current ripples from the generated local oscillator signal. In one embodiment, the balanced current pulses reduce at least the portion of harmonic current ripples from the LO signal with frequencies less than two times the frequency of the input signal.

Figure 11:
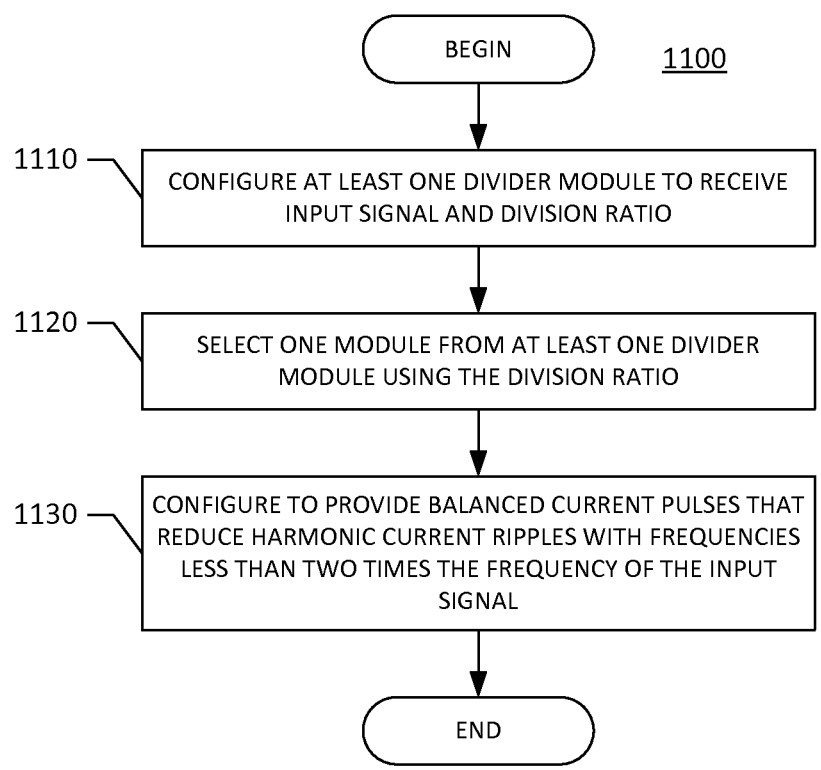
FIG. 11 is a functional flow diagram illustrating a method for generating an LO signal with reduced harmonic current ripple in accordance with another embodiment of the present disclosure.

FIG. 11 is a functional flow diagram illustrating a method 1100 for generating an LO signal with reduced harmonic current ripple in accordance with another embodiment of the present disclosure. In an alternative embodiment of FIG. 11, the method 1100 for generating an LO signal with reduced harmonic current ripple uses a selection of one divider module. Thus, the method 1100 includes configuring at least one divider module, at block 1110, to receive an input signal and a division ratio. The division ratio is used to select one module from at least one divider module, at block 1120. A load circuit is coupled to the at least one divider module, at block 1130, to provide balanced current pulses that reduce harmonic current ripples with frequencies less than two times the frequency of the input signal. In one embodiment, the load circuit includes blocks such as dividers, buffers/inverters, AND/NAND gates, OR/NOR gates and/or delay lines. In another embodiment, a balanced load is provided at output of at least one divider module.

Although several embodiments of the disclosure are described above, many variations of the disclosure are possible. For example, although the illustrated embodiments of FIGS. 4A, 5A, 6A, 7A, and 8A show LO signal generators, each with a mid-band filter 410, 510, 610, 710, or 810, this filter can be removed in certain situations. Further, features of the various embodiments may be combined in combinations that differ from those described above. Moreover, for clear and brief description, many descriptions of the systems and methods have been simplified. Many descriptions use terminology and structures of specific standards. However, the disclosed systems and methods are more broadly applicable.

Those of skill will appreciate that the various illustrative blocks and modules described in connection with the embodiments disclosed herein can be implemented in various forms. Some blocks and modules have been described above generally in terms of their functionality. How such functionality is implemented depends upon the design constraints imposed on an overall system. Skilled persons can implement the described functionality in varying ways for each particular application, but such implementation decisions should not be interpreted as causing a departure from the scope of the disclosure. In addition, the grouping of functions within a module, block, or step is for ease of description. Specific functions or steps can be moved from one module or block without departing from the disclosure.

The above description of the disclosed embodiments is provided to enable any person skilled in the art to make or use the disclosure. Various modifications to these embodiments will be readily apparent to those skilled in the art, and the generic principles described herein can be applied to other embodiments without departing from the spirit or scope of the disclosure. Thus, it is to be understood that the description and drawings presented herein represent presently preferred embodiments of the disclosure and are therefore representative of the subject matter which is broadly contemplated by the present disclosure. It is further understood that the scope of the present disclosure fully encompasses other embodiments that may become obvious to those skilled in the art and that the scope of the present disclosure is accordingly limited by nothing other than the appended claims.

What is claimed is:

1. A circuit for generating a local oscillator signal, the circuit comprising:
   at least one divider module configured to receive an input signal and divide a frequency of the input signal by a division ratio; and
   a load circuit coupled to the at least one divider module, the load circuit configured to provide balanced current pulses that substantially reduce at least a portion of harmonic current ripples in the local oscillator signal, wherein the load circuit comprises at least one of: a primary receiver local oscillator (LO) buffer, a diversity receiver LO buffer, and a dummy LO buffer.

2. The circuit of claim 1, wherein the balanced current pulses substantially reduce at least the portion of harmonic current ripples in the local oscillator signal with frequencies less than two times the frequency of the input signal.

3. The circuit of claim 1, wherein the at least one divider module is further configured to receive a division ratio signal which selects one module from the at least one divider module to divide the frequency of the input signal by the division ratio.

4. The circuit of claim 1, wherein the load circuit comprises at least one of: dividers; buffers; inverters; AND gates; NAND gates; OR gates; NOR gates; and delay lines.

5. The circuit of claim 1, wherein the input signal is a voltage controlled oscillator (VCO) signal.

6. The circuit of claim 1, wherein the load circuit is further configured to provide a balanced load at output of the at least one divider module.

7. The circuit of claim 1, wherein the at least one divider module comprises:
   a divide-by-2 module; a divide-by-3 module; and a divide-by-4 module.

8. The circuit of claim 7, wherein the load circuit comprises:
   at least one NAND gate coupled to the divide-by-2 module; and
   a plurality of LO buffers coupled to outputs of the at least one NAND gate.

9. The circuit of claim 7, wherein the load circuit comprises:
   a plurality of NAND gates coupled to the divide-by-4 module; and
   a plurality of local oscillator buffers coupled to the plurality of NAND gates.

10. The circuit of claim 7, wherein the load circuit comprises:
   a plurality of delay lines coupled to the divide-by-3 module;
   a plurality of NAND gates coupled to the plurality of delay lines; and
   a plurality of LO buffers coupled to the plurality of NAND gates.

11. A method of generating a local oscillator signal, the method comprising:
   receiving an input signal at at least one divider module;
   coupling a mid-band buffer to the at least one divider module;
   generating a local oscillator signal by dividing the received input signal via the at least one divider module using a division ratio; and
   configuring a load circuit to provide balanced current pulses that reduce at least a portion of harmonic current ripples from the generated local oscillator signal.

12. The method of claim 11, wherein the balanced current pulses reduce at least the portion of harmonic current ripples from the local oscillator signal with frequencies less than two times the frequency of the input signal.

13. The method of claim 11, further comprising
   balancing the load circuit at an output of the at least one divider module.

14. The method of claim 11, wherein the load circuit is balanced using, at least one of: dividers; buffers; inverters; AND gates; NAND gates; OR gates; NOR gates; and delay lines.

15. The method of claim 11, wherein the at least one divider module comprises:
   a divide-by-2 module; a divide-by-3 module; and a divide-by-4 module.

16. The method of claim 15, wherein configuring the load circuit to provide balanced current pulses comprises:
   coupling at least one NAND gate to the divide-by-2 module; and
   coupling a plurality of LO buffers to outputs of the at least one NAND gate.

17. The method of claim 15, wherein configuring the load circuit to provide balanced current pulses comprises:
   coupling a plurality of NAND gates to the divide-by-4 module; and
   coupling a plurality of local oscillator buffers to the plurality of NAND gates.

18. The method of claim 15, wherein configuring the load circuit to provide balanced current pulses comprises:
   coupling a plurality of delay lines to the divide-by-3 module;
   coupling a plurality of NAND gates to the plurality of delay lines; and
   coupling a plurality of LO buffers to the plurality of NAND gates.

19. An apparatus for generating a local oscillator signal, the apparatus comprising:
   means for dividing a received input signal by a division ratio to generate a local oscillator signal, the means for dividing comprising multiple dividing means;
   means for selecting one of the multiple dividing means configured to divide by the division ratio from the means for dividing; and
   means for providing balanced current pulses that reduce harmonic current ripples in the generated local oscillator signal.

20. The apparatus of claim 19, wherein the balanced current pulses reduce harmonic current ripples in the local oscillator signal with frequencies less than two times the frequency of the input signal.

21. The apparatus of claim 20, further comprising
   means for balancing a load circuit at an output of the means for dividing.

22. The apparatus of claim 21, wherein the means for balancing the load comprises at least one of: dividers; inverters; buffers; AND gates; NAND gates; OR gates; NOR gates; and delay lines.

23. The apparatus of claim 20, further comprising
   means for buffering a mid-band signal coupled to the means for dividing.

24. The apparatus of claim 20, wherein the means for dividing comprises:
   a divide-by-2 module; a divide-by-3 module; and a divide-by-4 module.

25. The apparatus of claim 24, wherein means for providing balanced current pulses comprises:
   at least one NAND gate coupled to the divide-by-2 module; and
   multiple means for buffering coupled to outputs of the at least one NAND gate.

26. The apparatus of claim 24, wherein means for providing balanced current pulses comprises:
   a plurality of NAND gates coupled to the divide-by-4 module; and
   multiple means for buffering coupled to the plurality of NAND gates.

27. The apparatus of claim 24, wherein means for providing balanced current pulses comprises:
   multiple means for providing delay coupled to the divide-by-3 module;
   a plurality of NAND gates coupled to the multiple means for providing delay; and
   multiple means for buffering coupled to the plurality of NAND gates.

* * * * *